United States Patent
Mao et al.

(10) Patent No.: US 11,440,835 B2
(45) Date of Patent: Sep. 13, 2022

(54) GLASS COMPOSITION

(71) Applicant: CDGM GLASS CO., LTD, Sichuan (CN)

(72) Inventors: Lulu Mao, Chengdu (CN); Bo Kuang, Chengdu (CN); Xiaochun Li, Chengdu (CN); Wei Sun, Chengdu (CN); Zhenyu Liu, Chengdu (CN); Liangzhen Hao, Chengdu (CN)

(73) Assignee: CDGM GLASS CO., LTD, Chengdu (CN)

( * ) Notice: Subject to any disclaimer, the term of this patent is extended or adjusted under 35 U.S.C. 154(b) by 281 days.

(21) Appl. No.: 16/759,766

(22) PCT Filed: Nov. 19, 2018

(86) PCT No.: PCT/CN2018/116148
§ 371 (c)(1),
(2) Date: Apr. 28, 2020

(87) PCT Pub. No.: WO2019/114499
PCT Pub. Date: Jun. 20, 2019

(65) Prior Publication Data
US 2021/0179480 A1    Jun. 17, 2021

(30) Foreign Application Priority Data

Dec. 15, 2017 (CN) .......................... 201711350694.1

(51) Int. Cl.
*C03C 3/087* (2006.01)
*G11B 5/73* (2006.01)
*H01L 23/10* (2006.01)

(52) U.S. Cl.
CPC .......... *C03C 3/087* (2013.01); *G11B 5/73921* (2019.05); *H01L 23/10* (2013.01)

(58) Field of Classification Search
None
See application file for complete search history.

(56) References Cited

U.S. PATENT DOCUMENTS

| | | | | |
|---|---|---|---|---|
| 3,804,646 A * | 4/1974 | Dumbaugh, Jr. | ........ | C03C 13/00 501/63 |
| 4,501,819 A * | 2/1985 | Yatsuda | ................... | C03C 3/093 501/61 |
| 5,532,194 A * | 7/1996 | Kawashima | ........ | C03C 10/0045 501/69 |
| 6,060,168 A * | 5/2000 | Kohli | ...................... | C03C 3/091 313/523 |
| 6,124,224 A * | 9/2000 | Sridharan | .................. | C03C 8/24 501/15 |
| 6,248,678 B1 * | 6/2001 | Pinckney | ............ | C03C 10/0045 501/69 |
| 6,387,509 B1 * | 5/2002 | Goto | ....................... | C03C 3/062 428/432 |
| 6,573,206 B1 * | 6/2003 | Nagata | .................... | C03C 3/085 428/846.9 |
| 6,713,419 B1 * | 3/2004 | Onozawa | ................ | C03C 3/068 501/78 |
| 6,818,574 B2 * | 11/2004 | Miyahara | ................ | C04B 37/04 257/E23.113 |
| 6,949,485 B2 * | 9/2005 | Nakashima | ............. | C03C 3/085 501/67 |
| 2002/0011080 A1 * | 1/2002 | Naka | ....................... | C03C 3/091 65/66 |

FOREIGN PATENT DOCUMENTS

| | | | | |
|---|---|---|---|---|
| CN | 1207086 A | * | 2/1999 | ............. C03C 3/062 |
| CN | 1207086 A | | 2/1999 | |
| CN | 1237546 A | | 12/1999 | |
| CN | 1290665 A | | 4/2001 | |
| CN | 1294093 A | | 5/2001 | |
| JP | 2000-159540 A | | 6/2000 | |

OTHER PUBLICATIONS

Machine Translation of CN 1207086 A (translation provided by Applicants on PTO-1449) (Year: 1999).*
Feb. 19, 2019 International Search Report issued in International Patent Application No. PCT/CN2018/116148.

* cited by examiner

*Primary Examiner* — Kevin M Bernatz
(74) *Attorney, Agent, or Firm* — Oliff PLC

(57) ABSTRACT

A glass composition with high Young's modulus and specific modulus, wherein the glass composition includes the following components by weight percentage: 30-46% of $SiO_2$, 0-6% of $B_2O_3$, 10-30% of $Al_2O_3$, 4-20% of CaO, 2-15% of MgO, and 13-32% of $Y_2O_3$. The glass composition uses common chemical raw materials. By reasonably arranging the contents of each component, the glass is good in heat resistance, chemical stability and press-molding devitrification resistance performance, low in high-temperature viscosity, convenient in bubble elimination, with specific modulus above 34 and Young's modulus above 100 GPa, and is suitable for hard disk substrate manufacturing, semiconductor sealing and other fields.

13 Claims, No Drawings

GLASS COMPOSITION

TECHNICAL FIELD

The present invention relates to a glass composition, in particular to a glass composition with high Young's modulus and specific modulus, suitable for hard disk substrate manufacturing and semiconductor sealing fields.

BACKGROUND

The reading speed of a hard disk is related to the rotation speed of the hard disk. The faster the rotation speed of hard disk is, the higher the reading speed will be. At present, a commercial hard disk generally rotates at a speed of 5200 RPM-10000 RPM. If the rotation speed needs to be further increased, the specific modulus of a hard disk substrate material must be increased, because if the specific modulus of the material used as the substrate is greater, the deformation of a hard disk substrate generated during high speed rotation will be less, and thus, the hard disk can achieve higher rotation speed. Since the specific modulus is the ratio of Young's modulus to density of a material (specific modulus=Young's modulus/density), higher Young's modulus and lower density are required for the material if the specific modulus needs to be increased. Currently, the specific modulus of the material used for the hard disk with rotation speed of 5200 RPM-10000 RPM is basically between 28 and 32. If the rotation speed of the hard disk needs to exceed 12000 RPM, or even 15000 RPM, the specific modulus of the glass material used needs to exceed 34 in order to meet the requirements.

The increase of the rotation speed of hard disk also causes the sharp increase in wear of a motor spindle, which requires thinner substrate for the high-speed hard disk to reduce weight, so as to reduce the wear of the motor spindle to prolong the service life of the hard disk. At present, the Young's modulus of a mainstream hard disk substrate is about 80 GPa, and the design thickness is about 0.65 mm. If the thickness of the hard disk substrate needs to be reduced to 0.4 mm or even less, the substrate material should have a Young's modulus of more than 100 GPa.

The storage density of the hard disk is now higher and higher, which requires sputtering magnetic materials onto the substrate material at higher temperature. Therefore, the substrate material of the hard disk is required to have higher heat resistance performance. It is generally believed that in order to meet the requirements of a new generation of hard disk technology in the future, the transition temperature (Tg temperature) of the glass material needs to be higher than 750° C. In addition, during the high temperature process of hard disk manufacturing, especially under the future process conditions with higher temperature, if the glass material contains alkali metal ions such as $Na^+$, $K^+$ and $Li^+$, these alkali metal ions are easy to precipitate contaminated magnetic materials during high temperature processing.

In the prior art, $SiO_2$—$Al_2O_3$—RO (RO refers to alkaline-earth metal oxide) alkali-free glass system is generally applied. Although the glass system disclosed by CN1207086A can achieve a density of less than 3.00 and a specific modulus of about 36, the high-temperature viscosity of this system glass is very high, and the viscosity at a temperature of 1400° C. is generally 400 P-600 P. During the production process, temperature of up to 1550° C. to 1600° C. and long clarification process are required to eliminate bubbles, which means lower yield, shorter furnace life and higher power consumption. More importantly, in order to obtain a good degree of bubble, this kind of glass needs to use $As_2O_3$ as clarifier, which is not allowed by the current environmental protection requirements. For the reading process with rotation speed up to 5200 RPM-15000 RPM, bubbles in the hard disk substrate will cause deviation from the center of gravity, resulting in fatal problems, so the hard disk substrate poses high requirements on the degree of bubble. In general, the degree of bubble in the glass blank needs to reach Grade A0 or above to meet the requirements. It is very difficult for the glass described in the above literature to reach Grade A0, in terms of the degree of bubble, in actual production.

SUMMARY

The technical problem to be solved by the present invention is to provide a glass composition with high Young's modulus and specific modulus.

To solve the technical problem, the technical solution of the present invention provides: a glass composition, comprising the following components by weight percentage: 30-46% of $SiO_2$, 0-6% of $B_2O_3$, 10-30% of $Al_2O_3$, 4-20% of CaO, 2-15% of MgO, and 13-32% of $Y_2O_3$.

Further, also comprising the following components by weight percentage: 0-7% of $TiO_2$, 0-5% of $ZrO_2$, 0-5% of SrO, 0-5% of BaO, 0-5% of ZnO, 0-15% of $La_2O_3$, 0-2% of $Sb_2O_3$, 0-2% of $CeO_2$, and 0-2% of $SnO_2$.

A glass composition, comprising the following components by weight percentage: 30-46% of $SiO_2$, 0-6% of $B_2O_3$, 10-30% of $Al_2O_3$, 4-20% of CaO, 2-15% of MgO, 13-32% of $Y_2O_3$, 0-7% of $TiO_2$, 0-5% of $ZrO_2$, 0-5% of SrO, 0-5% of BaO, 0-5% of ZnO, 0-15% of $La_2O_3$, 0-2% of $Sb_2O_3$, 0-2% of $CeO_2$, and 0-2% of $SnO_2$.

Further, the content of each component satisfies one or more of the following 8 conditions by weight percentage:
(1) $(SiO_2+Al_2O_3)/B_2O_3$ is 10-80;
(2) $Al_2O_3/B_2O_3$ is 4-36;
(3) $Al_2O_3/TiO_2$ is 3-41;
(4) CaO+MgO is not more than 21%;
(5) CaO/MgO is 0.8-8.0;
(6) $(CaO+MgO)/Y_2O_3$ is 0.2-1.0;
(7) $(CaO+MgO+Y_2O_3)/SiO_2$ is 0.5-1.5;
(8) $La_2O_3/Y_2O_3$ is not greater than 0.8.

Further, comprising 32-42% of $SiO_2$, and/or 0.5-6% of $B_2O_3$, and/or 15-28% of $Al_2O_3$, and/or 5-15% of CaO, and/or 3-10% of MgO, and/or 15-30% of $Y_2O_3$, and/or 0.5-7% of $TiO_2$, and/or 0-3% of $ZrO_2$, and/or 0-3% of SrO, and/or 0-3% of BaO, and/or 0-3% of ZnO, and/or 0-9% of $La_2O_3$, and/or 0-1% of $Sb_2O_3$, and/or 0-1% of $CeO_2$, and/or 0-1% of $SnO_2$.

Further, the content of each component satisfies one or more of the following 8 conditions by weight percentage:
(1) $(SiO_2+Al_2O_3)/B_2O_3$ is 15-70;
(2) $Al_2O_3/B_2O_3$ is 6-30;
(3) $Al_2O_3/TiO_2$ is 6-30;
(4) CaO+MgO is not more than 19%;
(5) CaO/MgO is 0.9-5.0;
(6) $(CaO+MgO)/Y_2O_3$ is 0.3-0.9;
(7) $(CaO+MgO+Y_2O_3)/SiO_2$ is 0.7-1.4;
(8) $La_2O_3/Y_2O_3$ is not greater than 0.4.

Further, comprising 34-40% of $SiO_2$, and/or 1-5% of $B_2O_3$, and/or 19-25% of $Al_2O_3$, and/or 6-10% of CaO, and/or 4-8% of MgO, and/or 18-26% of $Y_2O_3$, and/or 1-6% of $TiO_2$, and/or 0-2% of $ZrO_2$, and/or 0-2% of ZnO, and/or 0-5% of $La_2O_3$, and/or 0-0.5% of $Sb_2O_3$, and/or 0-0.5% of $CeO_2$, and/or 0-0.5% of $SnO_2$.

Further, the content of each component satisfies one or more of the following 8 conditions by weight percentage:
(1) $(SiO_2+Al_2O_3)/B_2O_3$ is 20-60;
(2) $Al_2O_3/B_2O_3$ is 8-20;
(3) $Al_2O_3/TiO_2$ is 8-20;
(4) CaO+MgO is not more than 18%;
(5) CaO/MgO is 1-2.5;
(6) $(CaO+MgO)/Y_2O_3$ is 0.4-0.8;
(7) $(CaO+MgO+Y_2O_3)/SiO_2$ is 0.8-1.3;
(8) $La_2O_3/Y_2O_3$ is not greater than 0.15.

Further, the specific modulus of the glass is above 34, preferably above 35, further preferably above 36; the Young's modulus is 100-130 Gpa, preferably 105-125 GPa, further preferably 110-120 GPa.

Further, Tg temperature of the glass is above 740° C., preferably above 750° C., more preferably above 760° C.; the devitrification resistance performance is Class B or above, preferably Class A or above.

Further, the viscosity of the glass is not more than 150 P at 1400° C., preferably not more than 130 P, further preferably not more than 110 P; the degree of glass bubble is Grade A0 or above, preferably Grade A00 or above.

A hard disk substrate, formed by the above glass composition.

Application of the above glass composition for the semiconductor sealing.

The beneficial effects of the present invention are as follows: the present invention uses common chemical raw materials; by reasonably arranging the contents of each component, the glass provided by the present invention is good in heat resistance, chemical stability and press-molding devitrification resistance performance, low in high-temperature viscosity, convenient in bubble elimination, with specific modulus above 34 and Young's modulus above 100 GPa, and is suitable for hard disk substrate manufacturing, semiconductor sealing and other fields.

DETAILED DESCRIPTION

Each component of the glass provided by the present invention is described hereunder, and the content thereof is represented by wt % unless otherwise stated.

$SiO_2$ is the main network forming body of the glass and the framework that forms the glass. In the glass provided by the present invention, when the content of $SiO_2$ is higher than 46%, the melting performance and Young's modulus of the glass will decrease, and the high-temperature viscosity will rise sharply; when the content of $SiO_2$ is lower than 30%, the chemical stability of the glass will be reduced, the devitrification resistance performance of the glass will decline rapidly, and meanwhile the density of the glass will rise rapidly, leading to a decrease of the specific modulus of glass. Therefore, the content of $SiO_2$ in the present invention is confined to 30-46%, preferably 32-42%, and further preferably 34-40%.

The glass provided by the present invention belongs to alkali-free glass with high dissolution temperature of raw material. Glass materials are easy to produce a large number of bubbles in the chemical tank in the initial melting stage. When the bubble is subject to heavy accumulation, the glass liquid will overflow the feeding tank, causing the stop of the feeding process and the subsequent homogenization, clarification and forming process in the continuous smelting process. Through dedicated research, the inventor found that adding a certain amount of $B_2O_3$ will reduce the bubble accumulation of the raw material in the initial melting stage, which is conducive to the smooth feeding process, especially when the content is more than 0.5%. However, when the addition of $B_2O_3$ is more than 6%, the specific modulus and Young's modulus of the glass will decrease, and meanwhile the chemical stability of the glass will decrease. Thus, the content of $B_2O_3$ is 0-6%, preferably 0.5-6%, more preferably 1-5%.

The addition of $Al_2O_3$ into the glass provided by the present invention can increase the Young's modulus of the glass, and meanwhile reduce the density of the glass and increase the specific modulus of the glass. If the content of $Al_2O_3$ is less than 10%, the specific modulus and Young's modulus of the glass will be lower than the design expectation, and the density of the glass will increase; if the content of $Al_2O_3$ is higher than 30%, the $Al_2O_3$ is very insoluble, which will cause the rapid decrease of melting performance of the glass raw material as well as the sharp rise of high-temperature viscosity of glass. Therefore, the addition of $Al_2O_3$ is confined to 10-30%, preferably 15-28%, further preferably 19-25%.

In the present invention, both $SiO_2$ and $Al_2O_3$ are insoluble oxides and key factors for bubble accumulation in the chemical tank. The inventor found through experiments that when the ratio of the total amount of $SiO_2$ and $Al_2O_3$ to $B_2O_3$ ($(SiO_2+Al_2O_3)/B_2O_3$) is in the range of 10-80, the bubble accumulation phenomenon basically disappears during glass melting, and the glass can maintain a high heat resistance. $(SiO_2+Al_2O_3)/B_2O_3$ is preferably 15-70, further preferably 20-60.

The addition of $B_2O_3$ will change the structure of $Al_2O_3$, so the selection of the relative content of $Al_2O_3$ and $B_2O_3$ is significantly associated with the high-temperature viscosity and specific modulus of the glass. When the ratio of $Al_2O_3$ to $B_2O_3$ ($Al_2O_3/B_2O_3$) is greater than 36, the high-temperature viscosity of the glass rises sharply; when $Al_2O_3/B_2O_3$ is less than 4, the specific modulus of the glass decreases sharply. Therefore, $Al_2O_3/B_2O_3$ is preferably to 4-36, preferably 6-30, further preferably 8-20.

Adding a small amount of $TiO_2$ can reduce the high-temperature viscosity of the glass and increase the specific modulus and Young's modulus of the glass; if the content of $TiO_2$ is more than 7%, the devitrification resistance capacity of the glass will decrease rapidly, so the content of $TiO_2$ in the present invention is confined to less than 7%. Through further research, it is found that if the content of $TiO_2$ is less than 0.5%, the effect of increasing Young's modulus, specific modulus and reducing high-temperature viscosity is not obvious. Therefore, the content of $TiO_2$ is preferably 0.5-7%, more preferably 1-6%.

In the glass provided by the present invention, because of the high content of $Al_2O_3$, the content of $TiO_2$ can promote the change of the structure of $Al_2O_3$, thus leading to the change of specific modulus and devitrification resistance performance of the glass. If the ratio of $Al_2O_3$ to $TiO_2$ ($Al_2O_3/TiO_2$) is higher than 41, the devitrification resistance performance of the glass will decrease and the high-temperature viscosity of the glass will increase; if $Al_2O_3/TiO_2$ is lower than 3, the specific modulus of the glass will decrease sharply, and the devitrification resistance performance of the glass will also decrease sharply. Therefore, $Al_2O_3/TiO_2$ is confined to 3-41, preferably 6-30, further preferably 8-20.

CaO, MgO, SrO, and BaO are alkaline-earth metal oxides. Adding an appropriate amount of alkaline-earth metal oxides into the glass can increase the Young's modulus of the glass, reduce the high-temperature viscosity of the glass, and meanwhile balance the glass components to improve the melting performance of the glass. However, excessive alkaline-earth metal oxides will reduce the devitrification resistance performance of glass. The devitrification resistance performance of glass is very important for the glass of hard disk substrate, because in the process of making the blank hard disk substrate, the glass block needs to be softened near the softening point of glass and pressed into a thin blank. If the glass's devitrification resistance performance is not good, devitrification particles will be generated in the glass. The physical properties of the hardness of the devitrification particles are vastly different from those of the surrounding glass, which will cause defects during processing and make the surface roughness of the substrate fail to meet the requirements.

The above four alkaline-earth metal oxides have common feature in reducing high temperature viscosity and improving the melting performance of glass, but with inconsistent and significantly different ability of reducing high-temperature viscosity and extent of the effect on the devitrification resistance performance of glass and the glass density as well as improvement in the Young's modulus and heat resistance.

According to the extensive experimental researches conducted by the inventor, it is found that the addition of MgO into glass can increase the Young's modulus and specific modulus of the glass and reduce the high-temperature viscosity of the glass, but if the content of MgO is less than 2%, the effect of reducing the density and increasing the Young's modulus and specific modulus is not obvious; if the content of MgO is more than 15%, the devitrification resistance performance of the glass will be significantly reduced. Therefore, the content of MgO is confined to 2-15%, preferably 3-10%, further preferably 4-8%.

CaO plays the most obvious role in reducing the high-temperature viscosity among these four alkaline-earth metal oxides; at the same time, CaO can increase the Young's modulus of glass. In the present invention, if the addition of CaO is less than 4%, the Young's modulus and specific modulus of the glass cannot meet the design requirements, and the effect of reducing the high-temperature viscosity of the glass is not obvious; if the content of CaO is higher than 20%, the devitrification resistance performance of the glass will decrease sharply, and meanwhile, the chemical stability of the glass, especially the water resistance, will decrease rapidly. Therefore, the content of CaO is confined to 4-20%, preferably 5-15%, further preferably 6-10%.

It is found through a large number of experiments that if the total content of MgO and CaO is more than 21% in the glass composition provided by the present invention, the heat resistance and devitrification resistance of the glass will decrease rapidly, preferably not more than 19%, and further preferably not more than 18%. In addition, if the ratio of Cao to MgO (CaO/MgO) is greater than 8.0, the specific modulus of the glass will decrease rapidly; if CaO/MgO is less than 0.8, the devitrification resistance performance of the glass will decrease rapidly, and the stability of the glass will be affected. Therefore, CaO/MgO is confined to 0.8-8.0, preferably 0.9-5.0, further preferably 1.0-2.5.

The ability of SrO to increase the Young's modulus and reduce the density of the glass is inferior to that of Cao and MgO. Adding a small amount of SrO can improve the devitrification resistance performance of the glass. If the content of SrO is higher than 5%, the devitrification resistance capacity of the glass will decrease, the chemical stability will decrease, and the cost of glass will increase significantly. Therefore, the content of SrO is confined to 0-5%, preferably 0-3%, further preferably 0%.

Compared with the other three alkaline-earth metal oxides, BaO can significantly increase the density of the glass and meanwhile cause the significant decrease of the chemical stability of the glass. A small amount of addition can improve the Young's modulus and devitrification resistance performance of the glass, but if the content of BaO is more than 5%, the density of the glass will increase significantly, and the chemical stability, especially the water resistance, will decrease rapidly. Therefore, the content of BaO is confined to 0-5%, preferably 0-3%, further preferably 0%.

The addition of $Y_2O_3$ into the glass can significantly increase the specific modulus, Young's modulus and heat resistance of the glass, and meanwhile reduce the high-temperature viscosity of the glass. If the content of $Y_2O_3$ is more than 32%, the devitrification resistance performance of the glass will decrease significantly, and the density will increase significantly; if the content of $Y_2O_3$ is lower than 13%, the high-temperature viscosity of the glass will not be reduced obviously, and the specific modulus, Young's modulus and heat resistance of the glass will fail to meet the design requirements. Therefore, the content of $Y_2O_3$ is confined to 13-32%, preferably 15-30%, further preferably 18-26%.

The inventor found that the total content of Cao and MgO and the relative content of $Y_2O_3$ can promote the change of the structure of $B_2O_3$, $Al_2O_3$ and $TiO_2$ in the glass, thus greatly affecting the specific modulus, heat resistance and devitrification resistance performance of the glass. When the ratio of Cao and MgO to $Y_2O_3$ ($(CaO+MgO)/Y_2O_3$) is greater than 1.0, the specific modulus and heat resistance of the glass decrease rapidly; when $(CaO+MgO)/Y_2O_3$ is less than 0.2, the devitrification resistance capacity of the glass decreases rapidly. Therefore, $(CaO/MgO)/Y_2O_3$ is confined to 0.2-1.0, preferably 0.3-0.9, further preferably 0.4-0.8.

These three oxides, i.e. Cao, MgO and $Y_2O_3$, can improve the specific modulus and Young's modulus and reduce the high-temperature viscosity of the glass. The inventor found through research that the total value of the above three oxides and the relative content of $SiO_2$ have a strong correlation with the high-temperature viscosity and heat resistance of the glass. If the ratio of Cao, MgO and $Y_2O_3$ to $SiO_2$ ($(CaO+MgO+Y_2O_3)/SiO_2$) is greater than 1.5, the heat resistance of the glass will decrease rapidly; if $(CaO+MgO+Y_2O_3)/SiO_2$ is less than 0.5, the high-temperature viscosity of the glass will fail to not meet the design requirements. Therefore, $(CaO/MgO+Y_2O_3)/SiO_2$ is confined to 0.5-1.5, preferably 0.7-1.4, further preferably 0.8-1.3.

Adding a small amount of $ZrO_2$ into the glass can improve the devitrification resistance and chemical stability of the glass. However, if the content of $ZrO_2$ is more than 5%, the solubility of the glass will be significantly reduced, and meanwhile the high-temperature viscosity of the glass will be significantly increased, and insoluble substances are easy to appear in the glass. Therefore, the content of $ZrO_2$ is confined to 0-5%, preferably 0-3%, further preferably 0-2%, more further preferably 0%.

Adding a small amount of ZnO into the glass can reduce the high-temperature viscosity of the glass and enhance the chemical stability of the glass. However, if the amount of ZnO is more than 5%, the Young's modulus of the glass will decrease, and meanwhile the density of the glass will increase, leading to rapid decrease of the specific modulus of the glass and the decrease of heat resistance of the glass. Therefore, the content of ZnO is confined to 0-5%, preferably 0-3%, more preferably 0-2%, further preferably 0%.

Adding an appropriate amount of $Al_2O_3$ into the glass can increase the Young's modulus of the glass, and meanwhile increase the Tg temperature of the glass, improve the heat resistance of the glass and reduce the high temperature viscosity of the glass. If the content of $Al_2O_3$ is more than 15%, the density of the glass will increase significantly, so that the specific modulus of the glass fails to meet the design requirements and the devitrification resistance performance of the glass will decrease significantly. Therefore, the content of $Al_2O_3$ is confined to 0-15%, preferably 0-9%, more preferably 0-5%, further preferably 0%.

Although both $La_2O_3$ and $Y_2O_3$ can improve the Young's modulus of glass, when the ratio of $La_2O_3$ to $Y_2O_3$ ($La_2O_3/Y_2O_3$) is greater than 0.8, the density of the glass will increase rapidly, leading to the rapid decrease of specific modulus of the glass and the rapid decrease of devitrification resistance performance of the glass. Therefore, $La_2O_3/Y_2O_3$ is not greater than 0.8, preferably not greater than 0.4, further preferably not greater than 0.15.

In addition, 0-2% clarifier can be introduced into the glass provided by the present invention, preferably 0-1%, further preferably 0-0.5. The clarifier can be one or more of $Sb_2O_3$, $CeO_2$ and $SnO_2$.

In the following paragraphs, the performance of optical glass provided in this invention will be described:

The Young's modulus E of the glass is tested by ultrasonic wave for P-wave velocity and S-wave velocity, and then calculated according to the following formula.

$$E = \frac{4G^2 - 4GV_T^2\rho}{G - V_T^2\rho}$$

In which: $G=V_S^2\rho$

Where:

E refers to Young's modulus, Pa;

G refers to shear modulus, Pa;

$V_T$ refers to P-wave velocity, m/s;

$V_S$ refers to S-wave velocity, m/s;

$\rho$ refers to glass density, $g/cm^3$;

The density of the glass is tested according to the method specified in GB/T7962.20-2010.

Specific modulus of the glass=Young's modulus/density.

The Tg temperature of the glass is tested according to the method specified in GB/T7962.16-2010.

The high-temperature viscosity of the glass (unit: dPaS/P) is measured by THETA Rheotronic II high temperature viscometer with rotation method. The smaller the value is, the smaller the viscosity is.

The devitrification resistance performance of the glass is tested by the following methods:

Process the experimental sample to 20*20*10 mm, polish both sides, put the sample into the crystallization furnace with the temperature of TG+200° C. for 30 minutes, take it out for cooling, then polish the two large surfaces, and judge the devitrification performance of the glass according to the table below. Grade A is the best, and Grade E is the worst.

| Grading and Judgment Standard of Devitrification | | |
|---|---|---|
| No. | Grade | Standard |
| 1 | A | No devitrification particles visible to the naked eyes |
| 2 | B | Devitrification particles visible to the naked eyes, with small quantity but scattered |
| 3 | C | Devitrification particles visible to the naked eyes, with larger dispersion or more intensive and small size |
| 4 | D | Large and dense devitrification particles |
| 5 | E | Glass with complete devitrification |

The bubble degree of the glass is measured and graded according to the method specified in GB/T7962.8-2010.

After testing, the specific modulus of the glass provided by the present invention is above 34, preferably above 35, further preferably above 36; the Young's modulus is 100-130 Gpa, preferably 105-125 GPa, further preferably 110-120 GPa; Tg temperature is above 740° C., preferably above 750° C., more preferably above 760° C.; the viscosity is not more than 150 P at 1400° C., preferably not more than 130 P, further preferably not more than 110 P; the press-molding devitrification resistance performance is Class B or above, preferably Class A or above; the degree of bubble is Grade A0 or above, preferably A00 or above.

Due to the above performance, the glass provided by the present invention is particularly suitable for forming a hard disk substrate and the application for semiconductor sealing.

Embodiments

To further understand the technical solution of the present invention, embodiments of the glass composition provided by the present invention are described as below. What shall be noted is that these embodiments do not limit the scope of the present invention.

The glass composition (Embodiments 1-50) shown in Tables 1-5 are formed by weighting based on the proportions of each embodiment in the table, mixing the ordinary raw materials for glass (such as oxide, hydroxide, carbonate and nitrate), placing the mixed raw materials in a platinum crucible, melting for 6-8 h at 1400-1450° C., obtaining homogeneous melted glass without bubbles and undissolved substances after clarification, stirring and homogenization, shaping the molten glass in a mould and performing annealing.

Tables 1-5 show the composition (wt %), Young's modulus (E), specific modulus (E/$\rho$), Tg temperature (Tg), and high-temperature viscosity at the temperature of 1400° C. (K), devitrification resistance performance grade (N) and degree of bubble (Q) in Embodiments 1-50 of the present invention, in which the value of $(SiO_2+Al_2O_3)/B_2O_3$ is denoted by A, the value of $Al_2O_3/B_2O_3$ is denoted by B, and the value of $Al_2O_3/TiO_2$ is denoted by C, the value of CaO+MgO is denoted by D, the value of CaO/MgO is represented by F, the value of $(CaO+MgO)/Y_2O_3$ is denoted by G, the value of $(CaO+MgO+Y_2O_3)/SiO_2$ is denoted by M, and the value of $La_2O_3/Y_2O_3$ is denoted by H.

TABLE 1

| Component | 1 | 2 | 3 | 4 | 5 | 6 | 7 | 8 | 9 | 10 |
|---|---|---|---|---|---|---|---|---|---|---|
| $SiO_2$ | 35.00 | 39.00 | 37.00 | 37.00 | 40.00 | 45.00 | 38.00 | 33.00 | 31.00 | 37.00 |
| $B_2O_3$ | 5.00 | 2.00 | 2.00 | 2.00 | 2.00 | 1.50 | 1.00 | 2.00 | 2.00 | 0.80 |
| ZnO | 1.00 | 0.00 | 0.00 | 0.00 | 0.00 | 0.00 | 0.00 | 0.00 | 0.00 | 0.00 |
| $TiO_2$ | 1.00 | 2.00 | 2.00 | 2.00 | 2.00 | 2.00 | 2.00 | 2.00 | 2.00 | 4.00 |
| $Al_2O_3$ | 22.00 | 20.00 | 17.00 | 24.00 | 24.00 | 23.00 | 23.00 | 28.00 | 24.00 | 24.00 |
| $ZrO_2$ | 0.50 | 0.50 | 0.70 | 1.00 | 0.70 | 2.00 | 1.00 | 1.00 | 1.00 | 1.00 |
| $Y_2O_3$ | 25.00 | 24.00 | 30.00 | 20.00 | 20.00 | 20.00 | 21.00 | 20.00 | 26.00 | 20.00 |

TABLE 1-continued

| Component | 1 | 2 | 3 | 4 | 5 | 6 | 7 | 8 | 9 | 10 |
|---|---|---|---|---|---|---|---|---|---|---|
| $La_2O_3$ | 1.00 | 0.00 | 0.00 | 0.00 | 0.00 | 0.00 | 0.00 | 0.00 | 0.00 | 0.00 |
| CaO | 5.00 | 7.00 | 7.00 | 7.00 | 7.00 | 4.00 | 7.00 | 7.00 | 7.00 | 7.00 |
| MgO | 4.00 | 5.00 | 4.00 | 6.70 | 4.00 | 2.00 | 6.70 | 6.70 | 6.70 | 5.90 |
| BaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| $CeO_2$ | 0.00 | 0.00 | 0.00 | 0.00 | 0.00 | 0.00 | 0.00 | 0.00 | 0.00 | 0.00 |
| $SnO_2$ | 0.00 | 0.00 | 0.00 | 0.00 | 0.00 | 0.00 | 0.00 | 0.00 | 0.00 | 0.00 |
| $Sb_2O_3$ | 0.50 | 0.50 | 0.30 | 0.30 | 0.30 | 0.50 | 0.30 | 0.30 | 0.30 | 0.30 |
| Total (%) | 100.00 | 100.00 | 100.00 | 100.00 | 100.00 | 100.00 | 100.00 | 100.00 | 100.00 | 100.00 |
| A | 11.40 | 29.50 | 27.00 | 30.50 | 32.00 | 45.33 | 61.00 | 30.50 | 27.50 | 76.25 |
| B | 4.40 | 10.00 | 8.50 | 12.00 | 12.00 | 15.33 | 23.00 | 14.00 | 12.00 | 30.00 |
| C | 22.00 | 10.00 | 8.50 | 12.00 | 12.00 | 11.50 | 11.50 | 14.00 | 12.00 | 6.00 |
| D | 9.00 | 12.00 | 11.00 | 13.70 | 11.00 | 6.00 | 13.70 | 13.70 | 13.70 | 12.90 |
| F | 1.25 | 1.40 | 1.75 | 1.04 | 1.75 | 2.00 | 1.04 | 1.04 | 1.04 | 1.19 |
| G | 0.41 | 0.60 | 0.65 | 0.57 | 0.46 | 0.26 | 0.60 | 0.49 | 0.57 | 0.54 |
| M | 0.97 | 0.92 | 1.11 | 0.91 | 0.78 | 0.58 | 0.91 | 1.02 | 1.28 | 0.89 |
| H | 0.04 | 0.00 | 0.00 | 0.00 | 0.00 | 0.00 | 0.00 | 0.00 | 0.00 | 0.00 |
| E (GPa) | 105.57 | 108.38 | 112.55 | 110.66 | 108.11 | 105.25 | 112.42 | 118.20 | 120.40 | 111.20 |
| $\rho$ (g/cm$^3$) | 3.10 | 3.05 | 3.20 | 3.02 | 2.95 | 2.85 | 3.01 | 2.99 | 3.10 | 3.02 |
| E/$\rho$ | 34.05 | 35.53 | 35.17 | 36.64 | 36.65 | 36.93 | 37.35 | 39.53 | 38.84 | 36.82 |
| Tg (° C.) | 762 | 780 | 800 | 781 | 805 | 820 | 785 | 798 | 805 | 781 |
| K | 78.1 | 75.6 | 73.1 | 80.1 | 110.8 | 140.2 | 78.5 | 101.4 | 50.6 | 70.3 |
| N | A | A | A | A | A | A | A | A | A | A |
| Q | A00 | A00 | A00 | A00 | A00 | A0 | A00 | A00 | A00 | A00 |

TABLE 2

| Component | 11 | 12 | 13 | 14 | 15 | 16 | 17 | 18 | 19 | 20 |
|---|---|---|---|---|---|---|---|---|---|---|
| $SiO_2$ | 39.00 | 38.00 | 36.00 | 38.00 | 37.00 | 35.00 | 36.00 | 35.00 | 37.00 | 37.00 |
| $B_2O_3$ | 0.80 | 1.20 | 2.00 | 2.00 | 2.00 | 1.00 | 1.00 | 2.00 | 4.00 | 2.00 |
| ZnO | 0.00 | 0.00 | 0.00 | 0.00 | 0.00 | 0.00 | 0.50 | 0.00 | 0.00 | 0.00 |
| $TiO_2$ | 6.50 | 3.00 | 0.70 | 2.00 | 2.00 | 5.00 | 2.50 | 2.00 | 2.00 | 3.00 |
| $Al_2O_3$ | 20.00 | 21.00 | 23.00 | 16.00 | 17.00 | 17.00 | 24.50 | 28.00 | 24.00 | 23.00 |
| $ZrO_2$ | 0.50 | 0.00 | 1.00 | 0.70 | 0.70 | 0.70 | 0.50 | 1.00 | 1.00 | 1.50 |
| $Y_2O_3$ | 20.00 | 22.00 | 15.00 | 30.00 | 29.00 | 29.00 | 22.00 | 22.00 | 20.00 | 22.00 |
| $La_2O_3$ | 0.00 | 0.00 | 1.00 | 0.00 | 0.00 | 0.00 | 0.00 | 0.00 | 0.00 | 2.00 |
| CaO | 7.00 | 10.00 | 13.00 | 7.00 | 7.00 | 7.00 | 8.00 | 5.00 | 7.00 | 5.00 |
| MgO | 5.00 | 3.50 | 8.00 | 4.00 | 4.00 | 4.00 | 5.00 | 4.70 | 4.50 | 4.00 |
| BaO | 0.70 | 0.00 | 0.00 | 0.00 | 0.50 | 0.50 | 0.00 | 0.00 | 0.00 | 0.30 |
| SrO | 0.00 | 0.80 | 0.00 | 0.00 | 0.50 | 0.50 | 0.00 | 0.00 | 0.00 | 0.00 |
| $CeO_2$ | 0.00 | 0.10 | 0.00 | 0.00 | 0.00 | 0.00 | 0.00 | 0.00 | 0.00 | 0.00 |
| $SnO_2$ | 0.00 | 0.10 | 0.00 | 0.00 | 0.00 | 0.00 | 0.00 | 0.00 | 0.00 | 0.00 |
| $Sb_2O_3$ | 0.50 | 0.30 | 0.30 | 0.30 | 0.30 | 0.30 | 0.00 | 0.30 | 0.50 | 0.20 |
| Total (%) | 100.00 | 100.00 | 100.00 | 100.00 | 100.00 | 100.00 | 100.00 | 100.00 | 100.00 | 100.00 |
| A | 73.75 | 49.17 | 29.50 | 27.00 | 27.00 | 52.00 | 60.50 | 31.50 | 15.25 | 30.00 |
| B | 25.00 | 17.50 | 11.50 | 8.00 | 8.50 | 17.00 | 24.50 | 14.00 | 6.00 | 11.50 |
| C | 3.08 | 7.00 | 32.86 | 8.00 | 8.50 | 3.40 | 9.80 | 14.00 | 12.00 | 7.67 |
| D | 12.00 | 13.50 | 21.00 | 11.00 | 11.00 | 11.00 | 13.00 | 9.70 | 11.50 | 9.00 |
| F | 1.40 | 2.86 | 1.63 | 1.75 | 1.75 | 1.75 | 1.60 | 1.06 | 1.56 | 1.25 |
| G | 0.60 | 0.64 | 0.91 | 0.69 | 0.65 | 0.65 | 0.53 | 0.35 | 0.48 | 0.39 |
| M | 0.82 | 0.93 | 1.00 | 1.08 | 1.08 | 1.14 | 0.97 | 0.91 | 0.85 | 0.84 |
| H | 0.00 | 0.00 | 0.07 | 0.00 | 0.00 | 0.00 | 0.00 | 0.00 | 0.00 | 0.09 |
| E (GPa) | 110.10 | 112.30 | 108.70 | 112.10 | 111.25 | 115.10 | 115.23 | 120.40 | 109.65 | 115.21 |
| $\rho$ (g/cm$^3$) | 3.02 | 3.08 | 3.12 | 3.11 | 3.21 | 3.17 | 3.07 | 3.05 | 3.00 | 3.08 |
| E/$\rho$ | 36.46 | 36.46 | 34.84 | 36.05 | 34.66 | 36.31 | 37.53 | 39.48 | 36.55 | 37.41 |
| Tg (° C.) | 780 | 790 | 775 | 801 | 803 | 785 | 795 | 802 | 772 | 785 |
| K | 85.2 | 84.2 | 67.8 | 77.1 | 79.2 | 82.6 | 70.3 | 68.3 | 80.5 | 70.7 |
| N | A | A | A | A | A | A | A | A | A | A |
| Q | A00 | A00 | A00 | A00 | A00 | A00 | A00 | A00 | A00 | A00 |

TABLE 3

| Component | 21 | 22 | 23 | 24 | 25 | 26 | 27 | 28 | 29 | 30 |
|---|---|---|---|---|---|---|---|---|---|---|
| $SiO_2$ | 30.20 | 37.20 | 42.20 | 34.20 | 40.20 | 38.70 | 35.70 | 43.70 | 32.20 | 40.70 |
| $B_2O_3$ | 1.20 | 2.00 | 2.60 | 2.20 | 3.40 | 3.50 | 2.80 | 2.00 | 1.10 | 3.20 |
| ZnO | 0.00 | 0.00 | 0.70 | 0.00 | 0.00 | 0.00 | 0.00 | 0.60 | 0.00 | 0.00 |
| $TiO_2$ | 2.00 | 1.90 | 2.00 | 5.70 | 1.10 | 1.60 | 5.40 | 1.40 | 1.60 | 0.60 |
| $Al_2O_3$ | 29.90 | 21.50 | 15.50 | 25.10 | 17.90 | 19.70 | 23.30 | 13.70 | 27.50 | 17.30 |
| $ZrO_2$ | 0.20 | 1.30 | 0.00 | 0.00 | 0.00 | 0.00 | 0.00 | 0.00 | 0.00 | 0.00 |
| $Y_2O_3$ | 13.10 | 22.00 | 28.00 | 18.40 | 25.60 | 23.80 | 20.20 | 29.80 | 16.00 | 26.20 |
| $La_2O_3$ | 3.00 | 0.00 | 0.00 | 0.90 | 0.00 | 0.00 | 0.00 | 0.00 | 3.00 | 0.00 |
| CaO | 17.20 | 10.00 | 4.20 | 7.00 | 8.50 | 9.70 | 8.50 | 4.20 | 9.20 | 8.10 |
| MgO | 2.90 | 3.80 | 4.50 | 4.00 | 3.00 | 2.50 | 3.80 | 4.30 | 8.00 | 3.60 |
| BaO | 0.00 | 0.00 | 0.00 | 1.00 | 0.00 | 0.00 | 0.00 | 0.00 | 0.00 | 0.00 |
| SrO | 0.00 | 0.00 | 0.00 | 1.00 | 0.00 | 0.00 | 0.00 | 0.00 | 1.00 | 0.00 |
| $CeO_2$ | 0.00 | 0.00 | 0.00 | 0.10 | 0.00 | 0.10 | 0.00 | 0.00 | 0.00 | 0.00 |
| $SnO_2$ | 0.00 | 0.00 | 0.00 | 0.10 | 0.00 | 0.10 | 0.00 | 0.00 | 0.00 | 0.00 |
| $Sb_2O_3$ | 0.30 | 0.30 | 0.30 | 0.30 | 0.30 | 0.30 | 0.30 | 0.30 | 0.40 | 0.30 |
| Total (%) | 100.00 | 100.00 | 100.00 | 100.00 | 100.00 | 100.00 | 100.00 | 100.00 | 100.00 | 100.00 |
| A | 50.08 | 29.35 | 22.19 | 26.95 | 17.09 | 16.69 | 21.07 | 28.70 | 54.27 | 18.13 |
| B | 24.92 | 10.75 | 5.96 | 11.41 | 5.26 | 5.63 | 8.32 | 6.85 | 25.00 | 5.41 |
| C | 14.95 | 11.32 | 7.75 | 4.40 | 16.27 | 12.31 | 4.31 | 9.79 | 17.19 | 28.83 |
| D | 20.10 | 13.80 | 8.70 | 11.00 | 11.50 | 12.20 | 12.30 | 8.50 | 17.20 | 11.70 |
| F | 5.93 | 2.63 | 0.93 | 1.75 | 2.83 | 3.88 | 2.24 | 0.98 | 1.15 | 2.25 |
| G | 0.67 | 0.64 | 0.56 | 0.44 | 0.64 | 0.62 | 0.53 | 0.62 | 0.63 | 0.68 |
| M | 1.10 | 0.96 | 0.87 | 0.86 | 0.92 | 0.93 | 0.91 | 0.88 | 1.03 | 0.93 |
| H | 0.23 | 0.00 | 0.00 | 0.05 | 0.00 | 0.00 | 0.00 | 0.00 | 0.19 | 0.00 |
| E (GPa) | 112.10 | 111.20 | 121.10 | 110.50 | 119.00 | 114.50 | 110.80 | 121.70 | 110.90 | 120.50 |
| ρ (g/cm³) | 3.11 | 3.03 | 3.03 | 3.09 | 3.00 | 3.00 | 3.06 | 3.07 | 3.15 | 2.99 |
| E/ρ | 36.05 | 36.70 | 39.98 | 35.76 | 39.67 | 38.17 | 36.21 | 39.67 | 35.21 | 40.30 |
| Tg (° C.) | 782 | 781 | 807 | 771 | 797 | 789 | 776 | 815 | 776 | 799 |
| K | 30.9 | 88.1 | 101.5 | 70.7 | 95.9 | 92.0 | 79.4 | 106.6 | 47.7 | 97.2 |
| N | A | A | A | A | A | A | A | A | A | A |
| Q | A00 | A00 | A00 | A00 | A00 | A00 | A00 | A00 | A00 | A00 |

TABLE 4

| Component | 31 | 32 | 33 | 34 | 35 | 36 | 37 | 38 | 39 | 40 |
|---|---|---|---|---|---|---|---|---|---|---|
| $SiO_2$ | 33.20 | 38.20 | 36.70 | 41.70 | 31.20 | 44.20 | 35.20 | 39.70 | 33.70 | 42.70 |
| $B_2O_3$ | 1.70 | 3.00 | 3.20 | 2.80 | 1.00 | 2.50 | 2.60 | 3.60 | 2.00 | 2.40 |
| ZnO | 0.00 | 2.50 | 0.00 | 0.00 | 0.00 | 0.00 | 0.00 | 0.00 | 0.30 | 0.00 |
| $TiO_2$ | 5.90 | 0.50 | 2.00 | 3.00 | 1.80 | 1.20 | 5.50 | 1.00 | 5.80 | 1.80 |
| $Al_2O_3$ | 26.30 | 20.30 | 22.10 | 16.10 | 28.70 | 13.10 | 23.90 | 18.50 | 25.70 | 14.90 |
| $ZrO_2$ | 4.00 | 0.00 | 1.00 | 0.00 | 0.00 | 0.00 | 0.10 | 0.00 | 0.00 | 0.00 |
| $Y_2O_3$ | 17.20 | 23.20 | 21.40 | 27.40 | 14.30 | 30.40 | 19.60 | 25.00 | 17.80 | 28.60 |
| $La_2O_3$ | 0.00 | 0.00 | 0.00 | 0.00 | 7.00 | 0.00 | 1.00 | 0.00 | 5.00 | 0.00 |
| CaO | 5.20 | 10.10 | 9.50 | 4.20 | 13.20 | 4.20 | 8.00 | 8.90 | 4.00 | 4.80 |
| MgO | 5.00 | 2.60 | 3.80 | 4.00 | 2.50 | 4.20 | 3.80 | 3.00 | 4.00 | 4.50 |
| BaO | 0.20 | 0.00 | 0.00 | 0.50 | 0.00 | 0.00 | 0.00 | 0.00 | 0.00 | 0.00 |
| SrO | 1.00 | 0.00 | 0.00 | 0.00 | 0.00 | 0.00 | 0.00 | 0.00 | 1.00 | 0.00 |
| $CeO_2$ | 0.00 | 0.00 | 0.00 | 0.00 | 0.00 | 0.00 | 0.00 | 0.00 | 0.20 | 0.00 |
| $SnO_2$ | 0.00 | 0.00 | 0.00 | 0.00 | 0.00 | 0.00 | 0.00 | 0.00 | 0.20 | 0.00 |
| $Sb_2O_3$ | 0.30 | 0.10 | 0.30 | 0.30 | 0.30 | 0.20 | 0.30 | 0.30 | 0.30 | 0.30 |
| Total (%) | 100.00 | 100.50 | 100.00 | 100.00 | 100.00 | 100.00 | 100.00 | 100.00 | 100.00 | 100.00 |
| A | 35.00 | 19.50 | 18.38 | 20.64 | 59.90 | 22.92 | 22.73 | 16.17 | 29.70 | 24.00 |
| B | 15.47 | 6.77 | 6.91 | 5.75 | 28.70 | 5.24 | 9.19 | 5.14 | 12.85 | 6.21 |
| C | 4.46 | 40.60 | 11.05 | 5.37 | 15.94 | 10.92 | 4.35 | 18.50 | 4.43 | 8.28 |
| D | 10.20 | 12.70 | 13.30 | 8.20 | 15.70 | 8.40 | 11.80 | 11.90 | 8.00 | 9.30 |
| F | 1.04 | 3.88 | 2.50 | 1.05 | 5.28 | 1.00 | 2.11 | 2.97 | 1.00 | 1.07 |
| G | 0.39 | 0.63 | 0.60 | 0.51 | 0.55 | 0.64 | 0.49 | 0.64 | 0.31 | 0.62 |
| M | 0.83 | 0.94 | 0.95 | 0.85 | 0.96 | 0.88 | 0.89 | 0.93 | 0.77 | 0.89 |
| H | 0.00 | 0.00 | 0.00 | 0.00 | 0.49 | 0.00 | 0.05 | 0.00 | 0.28 | 0.00 |
| E (GPa) | 110.30 | 113.00 | 111.10 | 120.90 | 111.50 | 121.90 | 110.70 | 117.50 | 110.40 | 121.30 |
| ρ (g/cm³) | 3.11 | 3.01 | 3.04 | 3.02 | 3.15 | 3.08 | 3.07 | 3.02 | 3.10 | 3.04 |
| E/ρ | 35.47 | 37.54 | 36.55 | 40.09 | 35.40 | 39.57 | 36.06 | 38.91 | 35.61 | 39.88 |
| Tg (° C.) | 774 | 786 | 779 | 804 | 779 | 817 | 774 | 794 | 772 | 810 |
| K | 56.1 | 90.7 | 85.2 | 99.8 | 39.3 | 108.3 | 76.5 | 94.6 | 60.3 | 103.2 |
| N | A | A | A | A | A | A | A | A | A | A |
| Q | A00 | A00 | A00 | A00 | A00 | A00 | A00 | A00 | A00 | A00 |

TABLE 5

| Component | 41 | 42 | 43 | 44 | 45 | 46 | 47 | 48 | 49 | 50 |
|---|---|---|---|---|---|---|---|---|---|---|
| $SiO_2$ | 34.70 | 31.70 | 41.20 | 37.70 | 43.20 | 32.70 | 44.70 | 36.20 | 39.20 | 30.70 |
| $B_2O_3$ | 2.40 | 0.80 | 3.00 | 2.50 | 2.20 | 1.40 | 2.50 | 3.00 | 4.00 | 0.90 |
| ZnO | 0.00 | 0.00 | 0.00 | 0.00 | 0.00 | 0.00 | 0.00 | 0.00 | 0.00 | 0.30 |
| $TiO_2$ | 5.60 | 1.70 | 0.60 | 1.80 | 1.60 | 6.00 | 0.90 | 5.30 | 1.00 | 1.90 |
| $Al_2O_3$ | 24.50 | 28.10 | 16.70 | 20.90 | 14.30 | 26.90 | 12.50 | 22.70 | 19.10 | 29.30 |
| $ZrO_2$ | 2.00 | 0.00 | 0.00 | 0.00 | 0.60 | 0.50 | 0.00 | 0.00 | 0.00 | 0.00 |
| $Y_2O_3$ | 19.00 | 15.40 | 26.80 | 22.60 | 29.20 | 16.60 | 31.00 | 20.80 | 24.40 | 13.70 |
| $La_2O_3$ | 0.00 | 7.00 | 0.00 | 0.00 | 0.00 | 1.10 | 0.00 | 0.00 | 0.00 | 5.00 |
| CaO | 7.50 | 11.20 | 7.70 | 10.50 | 4.20 | 7.20 | 4.20 | 9.00 | 9.30 | 15.20 |
| MgO | 3.80 | 3.80 | 4.60 | 3.70 | 4.40 | 7.30 | 4.10 | 2.70 | 2.60 | 2.30 |
| BaO | 0.00 | 0.00 | 0.00 | 0.00 | 0.00 | 0.00 | 0.00 | 0.00 | 0.00 | 0.40 |
| SrO | 0.00 | 0.00 | 0.00 | 0.00 | 0.00 | 0.00 | 0.00 | 0.00 | 0.00 | 0.00 |
| $CeO_2$ | 0.10 | 0.00 | 0.00 | 0.00 | 0.00 | 0.00 | 0.00 | 0.00 | 0.10 | 0.00 |
| $SnO_2$ | 0.10 | 0.00 | 0.00 | 0.00 | 0.00 | 0.00 | 0.00 | 0.00 | 0.10 | 0.00 |
| $Sb_2O_3$ | 0.30 | 0.30 | 0.30 | 0.30 | 0.30 | 0.30 | 0.10 | 0.30 | 0.20 | 0.30 |
| Total (%) | 100.00 | 100.00 | 100.90 | 100.00 | 100.00 | 100.00 | 100.00 | 100.00 | 100.00 | 100.00 |
| A | 24.67 | 74.75 | 19.30 | 23.44 | 26.14 | 42.57 | 22.88 | 19.63 | 14.58 | 66.67 |
| B | 10.21 | 35.13 | 5.57 | 8.36 | 6.50 | 19.21 | 5.00 | 7.57 | 4.77 | 32.56 |
| C | 4.38 | 16.53 | 27.83 | 11.61 | 8.94 | 4.48 | 13.89 | 4.28 | 19.10 | 15.42 |
| D | 11.30 | 15.00 | 12.30 | 14.20 | 8.60 | 14.50 | 8.30 | 11.70 | 11.90 | 17.50 |
| F | 1.97 | 2.95 | 1.67 | 2.84 | 0.95 | 0.99 | 1.02 | 3.33 | 3.58 | 6.61 |
| G | 0.46 | 0.53 | 0.74 | 0.68 | 0.60 | 0.54 | 0.66 | 0.52 | 0.62 | 0.60 |
| M | 0.87 | 0.96 | 0.95 | 0.98 | 0.88 | 0.95 | 0.88 | 0.90 | 0.93 | 1.02 |
| H | 0.00 | 0.45 | 0.00 | 0.00 | 0.00 | 0.07 | 0.00 | 0.00 | 0.00 | 0.36 |
| E (GPa) | 110.60 | 111.20 | 120.70 | 111.50 | 121.50 | 110.60 | 122.10 | 110.90 | 116.00 | 111.80 |
| ρ (g/cm³) | 3.08 | 3.17 | 3.00 | 3.02 | 3.06 | 3.14 | 3.09 | 3.05 | 3.01 | 3.13 |
| E/ρ | 35.91 | 35.08 | 40.19 | 36.92 | 39.77 | 35.22 | 39.46 | 36.36 | 38.54 | 35.72 |
| Tg (° C.) | 773 | 778 | 802 | 784 | 812 | 775 | 820 | 778 | 791 | 781 |
| K | 73.6 | 43.5 | 98.5 | 89.4 | 104.9 | 51.9 | 110.0 | 82.3 | 93.3 | 35.1 |
| N | A | A | A | A | A | A | A | A | A | A |
| Q | A00 | A00 | A00 | A00 | A00 | A00 | A00 | A00 | A00 | A00 |

The invention claimed is:

1. A glass composition, comprising the following components by weight percentage: 30-46% of $SiO_2$, 0.5-6% of $B_2O_3$, 10-30% of $Al_2O_3$, 4-20% of CaO, 2-15% of MgO, and 13-32% of $Y_2O_3$,
wherein the weight percentage of $Al_2O_3$ and the weight percentage of $B_2O_3$ satisfy a ratio of $Al_2O_3/B_2O_3$ in a range of 4-36.

2. The glass composition according to claim 1, also comprising the following components by weight percentage: 0-7% of $TiO_2$, 0-5% of $ZrO_2$, 0-5% of SrO, 0-5% of BaO, 0-5% of ZnO, 0-15% of $La_2O_3$, 0-2% of $Sb_2O_3$, 0-2% of $CeO_2$, and 0-2% of $SnO_2$.

3. The glass composition according to claim 1, wherein the content of each component satisfies one or more of the following conditions by weight percentage:
  (1) $(SiO_2+Al_2O_3)/B_2O_3$ is 10-80;
  (2) $Al_2O_3/TiO_2$ is 3-41;
  (3) CaO+MgO is not more than 21%;
  (4) CaO/MgO is 0.8-8.0;
  (5) $(CaO+MgO)/Y_2O_3$ is 0.2-1.0;
  (6) $(CaO+MgO+Y_2O_3)/SiO_2$ is 0.5-1.5;
  (7) $La_2O_3/Y_2O_3$ is not greater than 0.8.

4. The glass composition according to claim 1, comprising 32-42% of $SiO_2$, and/or 15-28% of $Al_2O_3$, and/or 5-15% of CaO, and/or 3-10% of MgO, and/or 15-30% of $Y_2O_3$, and/or 0.5-7% of $TiO_2$, and/or 0-3% of $ZrO_2$, and/or 0-3% of SrO, and/or 0-3% of BaO, and/or 0-3% of ZnO, and/or 0-9% of $La_2O_3$, and/or 0-1% of $Sb_2O_3$, and/or 0-1% of $CeO_2$, and/or 0-1% of $SnO_2$.

5. The glass composition according to claim 1, wherein the content of each component satisfies one or more of the following 8 conditions by weight percentage:
  (1) $(SiO_2+Al_2O_3)/B_2O_3$ is 15-70;
  (2) $Al_2O_3/B_2O_3$ is 6-30;
  (3) $Al_2O_3/TiO_2$ is 6-30;
  (4) CaO+MgO is not more than 19%;
  (5) CaO/MgO is 0.9-5.0;
  (6) $(CaO+MgO)/Y_2O_3$ is 0.3-0.9;
  (7) $(CaO+MgO+Y_2O_3)/SiO_2$ is 0.7-1.4;
  (8) $La_2O_3/Y_2O_3$ is not greater than 0.4.

6. The glass composition according to claim 1, comprising 34-40% of $SiO_2$, and/or 1-5% of $B_2O_3$, and/or 19-25% of $Al_2O_3$, and/or 6-10% of CaO, and/or 4-8% of MgO, and/or 18-26% of $Y_2O_3$, and/or 1-6% of $TiO_2$, and/or 0-2% of $ZrO_2$, and/or 0-2% of ZnO, and/or 0-5% of $La_2O_3$, and/or 0-0.5% of $Sb_2O_3$, and/or 0-0.5% of $CeO_2$, and/or 0-0.5% of $SnO_2$.

7. The glass composition according to claim 1, wherein the content of each component satisfies one or more of the following 8 conditions by weight percentage:
  (1) $(SiO_2+Al_2O_3)/B_2O_3$ is 20-60;
  (2) $Al_2O_3/B_2O_3$ is 8-20;
  (3) $Al_2O_3/TiO_2$ is 8-20;
  (4) CaO+MgO is not more than 18%;
  (5) CaO/MgO is 1-2.5;
  (6) $(CaO+MgO)/Y_2O_3$ is 0.4-0.8;
  (7) $(CaO+MgO+Y_2O_3)/SiO_2$ is 0.8-1.3;
  (8) $La_2O_3/Y_2O_3$ is not greater than 0.15.

8. The glass composition according to claim 1, wherein the specific modulus of the glass is above 34; and the Young's modulus is 100-130 GPa.

9. The glass composition according to claim 1, wherein Tg temperature of the glass is above 740° C.; and the devitrification resistance performance is Class B or above.

10. The glass composition according to claim 1, wherein the viscosity of the glass is not more than 150 P at 1400° C.; and the degree of glass bubble is Grade A0 or above.

11. A hard disk substrate, formed by the glass composition according to claim 1.

12. A method for sealing a semiconductor comprising applying the glass composition according to claim 1 to a surface of the semiconductor.

13. A glass composition, consisting of the following components by weight percentage: 30-46% of $SiO_2$, 0.5-6% of $B_2O_3$, 10-30% of $Al_2O_3$, 4-20% of CaO, 2-15% of MgO, 13-32% of $Y_2O_3$, 0-7% of $TiO_2$, 0-5% of $ZrO_2$, 0-5% of SrO, 0-5% of BaO, 0-5% of ZnO, 0-15% of $La_2O_3$, 0-2% of $Sb_2O_3$, 0-2% of $CeO_2$, and 0-2% of $SnO_2$.

* * * * *